(12) United States Patent
Hillstrom

(10) Patent No.: US 7,113,879 B2
(45) Date of Patent: Sep. 26, 2006

(54) USING VECTOR NETWORK ANALYZER FOR ALIGNING OF TIME DOMAIN DATA

(75) Inventor: Timothy L. Hillstrom, Liberty Lake, WA (US)

(73) Assignee: Agilent Technologies, Inc., Palo Alto, CA (US)

( * ) Notice: Subject to any disclaimer, the term of this patent is extended or adjusted under 35 U.S.C. 154(b) by 35 days.

(21) Appl. No.: 10/698,278

(22) Filed: Oct. 31, 2003

(65) Prior Publication Data

US 2005/0096860 A1 May 5, 2005

(51) Int. Cl.
*G01R 23/14* (2006.01)

(52) U.S. Cl. ............... 702/106; 324/76.12; 324/76.39; 702/76; 702/122; 455/115.1

(58) Field of Classification Search ............... 702/76, 702/106, 122; 324/76.12, 76.39; 455/423–425, 455/67.11, 67.14, 67.16, 69, 70, 101, 103, 455/115.1–115.4, 132–134, 226.1–226.4, 455/236.1–237.1, 277.1
See application file for complete search history.

(56) References Cited

U.S. PATENT DOCUMENTS

| | | | | |
|---|---|---|---|---|
| 4,630,228 | A * | 12/1986 | Tarczy-Hornoch et al. | ... 702/59 |
| 4,816,767 | A * | 3/1989 | Cannon et al. | ............. 324/601 |
| 5,062,703 | A * | 11/1991 | Wong et al. | ................ 356/73.1 |
| 5,307,284 | A * | 4/1994 | Brunfeldt et al. | ............. 702/76 |
| 5,376,889 | A * | 12/1994 | Milroy et al. | ................ 324/644 |
| 5,408,690 | A * | 4/1995 | Ishikawa et al. | ......... 455/115.4 |
| 5,633,801 | A * | 5/1997 | Bottman | ...................... 702/65 |
| 5,656,932 | A * | 8/1997 | Kitayoshi | ................... 324/615 |
| 5,977,779 | A * | 11/1999 | Bradley | ...................... 324/638 |
| 6,025,709 | A * | 2/2000 | Bradley | ................... 324/158.1 |
| 6,437,578 | B1 * | 8/2002 | Gumm | ....................... 324/533 |
| 6,525,545 | B1 * | 2/2003 | Hill | ............................. 324/642 |
| 6,590,399 | B1 * | 7/2003 | Karl et al. | ................... 324/637 |
| 6,842,011 | B1 * | 1/2005 | Page et al. | .................. 324/637 |
| 6,842,614 | B1 * | 1/2005 | Noe | ........................... 455/423 |
| 2002/0118024 | A1 * | 8/2002 | Hill | ............................. 324/642 |
| 2002/0130667 | A1 * | 9/2002 | Noe | ........................... 324/534 |
| 2003/0095697 | A1 * | 5/2003 | Wood et al. | ................ 382/131 |
| 2004/0051538 | A1 * | 3/2004 | Adamian | .................... 324/601 |

OTHER PUBLICATIONS

"PNA Series Microwave Network Analyzers", data sheet, obtained on-line, http://we.home.agilent.com/cgi-bin/bvpub/agilent/product/cp_Product.jsp?NAV_ID, 2 pages.

"8510 Network Analyzer Systems, 45 MHz to 110 GHz", data sheet, obtained on-line, http://we.home.agilent.com/cgi-bin/bvpub/agilent/product/cp_Product.jsp?NAV_ID, 3 pages.

\* cited by examiner

*Primary Examiner*—Carol S. W. Tsai

(57) ABSTRACT

A method of using a vector network analyzer (VNA) for coordinated Voltage Standing-Wave Ratio (VSWR) and Time Domain Reflectometry (TDR) measurement includes configuring the VNA for identifying discontinuities correlated to a VSWR lobe. In some embodiments, the method includes identifying a largest VSWR lobe in a frequency band of interest, using phase data associated with an $S_{11}$ scattering parameter to find the correct electrical delay required to align Low Pass Step Transform data, and configuring the Low Pass Step Transform span and center time to align coherent inductive and capacitive discontinuities relative to grid lines of a TDR display. In some embodiments, the method is automated.

14 Claims, 4 Drawing Sheets

USING VECTOR NETWORK ANALYZER FOR ALIGNING OF TIME DOMAIN DATA

TECHNICAL FIELD

The invention relates to electromagnetic devices and particularly to using a vector network analyzer for aligning of time domain data.

BACKGROUND OF THE INVENTION

Improving Voltage Standing-Wave Ratio (VSWR) is typically an iterative trial-and-error exercise when utilizing either frequency or time-domain information. For example, while circuit modifications which decrease Time Domain Reflectometry (TDR) "bumps" (discontinuities) are generally advantageous, decreasing a specific TDR bump does not necessarily improve VSWR within a frequency band of interest, but can actually degrade it.

BRIEF SUMMARY OF THE INVENTION

A method of using a vector network analyzer (VNA) for coordinated Voltage Standing-Wave Ratio (VSWR) and Time Domain Reflectometry (TDR) measurement is provided. The method includes configuring the VNA for identifying discontinuities correlated to a VSWR lobe. In some embodiments, the method includes identifying a largest VSWR lobe in a frequency band of interest, using phase data associated with an $S_{11}$ scattering parameter to find the correct electrical delay required to align Low Pass Step Transform data, and configuring the Low Pass Step Transform span and center time to align coherent inductive and capacitive discontinuities relative to grid lines of a TDR display. In some embodiments, the method is automated.

A system for concurrent frequency and time domain reflectometry measurements of an electromagnetic device is provided. The system includes a vector network analyzer (VNA) providing a visual display, and a processor associated with the VNA. The processor is operable to process the signal for graphic presentation on the visual display.

DETAILED DESCRIPTION OF THE INVENTION

By using both frequency and time domain reflection measurements in conjunction, it is possible to positively identify the specific circuit discontinuities which contribute to a given Voltage Standing-Wave Ratio (VSWR) lobe. Optionally, corrective action can then be readily determined for optimum VSWR performance. VSWR is a well-known measure of reflections from a device.

Improving VSWR is typically an iterative trial-and-error exercise when utilizing either frequency or time-domain information. For example, while circuit modifications which decrease Time Domain Reflectometry (TDR) "bumps" (discontinuities) are generally advantageous, decreasing a specific TDR bump does not necessarily improve VSWR within a frequency band of interest, but can actually degrade it.

However, by using information in both frequency and time domains concurrently, one can determine specific TDR discontinuities which contribute to specific VSWR lobes. This is performed advantageously using a Vector Network Analyzer (VNA), which measures time domain reflection data from a device, because: (1) vector data is necessary to transform to a TDR display; and (2) phase information in the $S_{11}$ data is necessary to find the correct time alignment of the TDR data. $S_{11}$ is a vector "scattering parameter," which measures the fractional reflected signal from a device. It is directly related to VSWR, as described below in more detail. $S_{11}$ and VSWR are both frequency-domain parameters. Lobes are local peaks, which look like randomized peaks located along the x-axis in an $S_{11}$ or VSWR measurement display. The lobes denote local maxima of reflected energy, which degrade the performance of a device.

Figure 1:
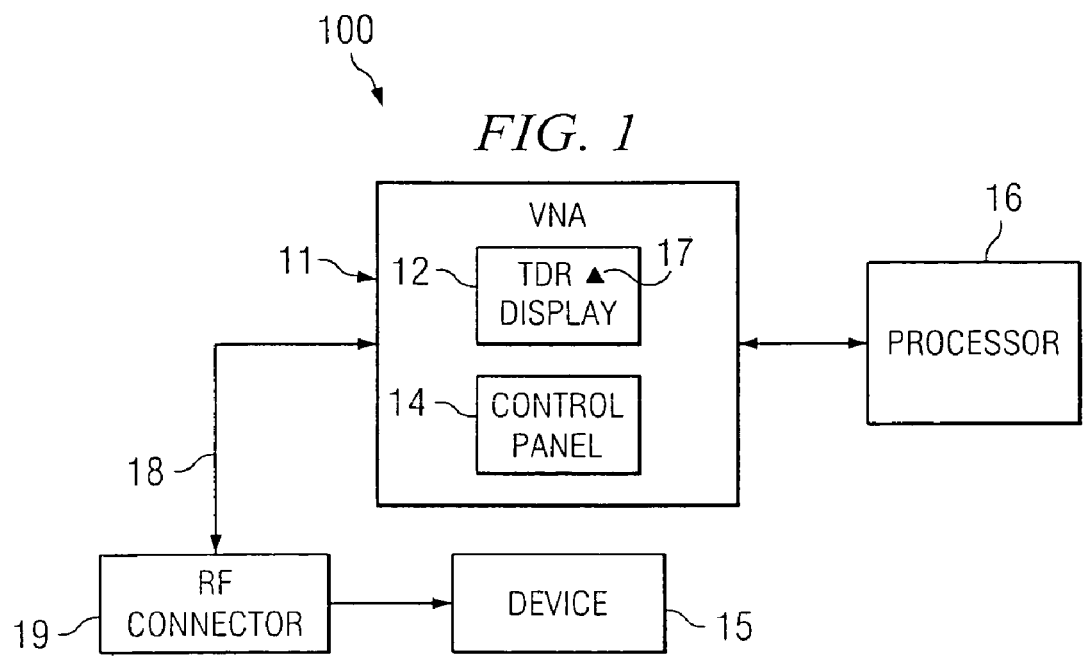
FIG. 1 is a block diagram illustrating a typical TDR measurement system, in accordance with embodiments of the invention.

FIG. 1 is a block diagram illustrating typical TDR measurement system 100, in accordance with embodiments of the invention. VNA 11 interfaces with DUT 15 through a standard coax cable 18 and RF connector 19 (usually type-N or SMA). Processor 16 associated with VNA 11 converts the measurement signal data into TDR display 12. In alternative embodiments, circuitry internal to VNA 11 performs the functions of processor 16. VNA 11 provides a user interface, for example control panel 14, and user-scrollable display marker 17 having a dot, triangle, or other recognizable shape.

Although the terms VSWR and $S_{11}$ are in practice often used interchangeably, $S_{11}$ specifically contains the necessary phase information. VSWR and $S_{11}$ are alternative representations of reflected energy related to one another by Equation (1):

$$VSWR = (1+|S_{11}|)/(1-|S_{11}|) \qquad (1)$$

Although scaled differently, both quantities increase with increasing reflected energy.

There are multiple versions of TDR measurements and transforms. A useful version for purposes of illustration is a "Low Pass Step Transform." This is a menu choice on commercially available VNAs, for example the Agilent Technology PNA (acronym for "performance network analyzer") and 8510 Vector Network Analyzers. More detailed information regarding these instruments may be found in their respective product data sheets available at the Agilent Technologies web page on the Internet, http:/we.home.agilent.com/.

Figure 2:
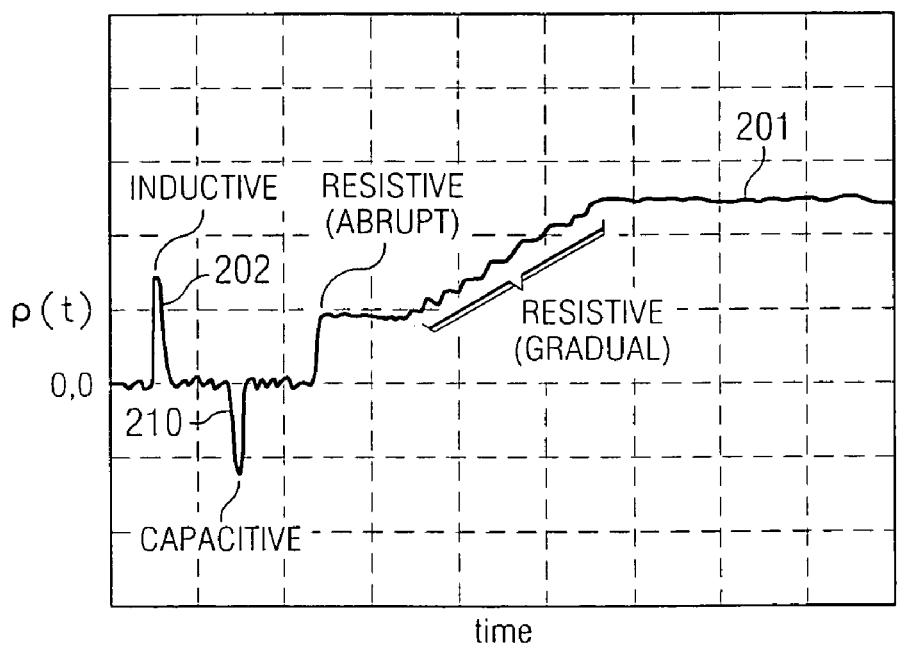
FIG. 2 is a graph depicting a Low Pass Step Transform as a function of time on a TDR display.

FIG. 2 is a graph depicting Low Pass Step Transform 201 as a function of time using an arbitrary scale on TDR display 12. Time scales are typically in a range from tenths of a nanosecond per division to a few nanoseconds per division.

As shown in FIG. 2, the Low Pass Step Transform is advantageous, because it clearly identifies capacitive, inductive, and resistive discontinuities. The term "capacitive discontinuity" refers implicitly to a region of excess shunt capacitance on the TDR display, whereas "inductive discontinuity" refers implicitly to a region of excess series inductance on the TDR display. Excess capacitance or excess inductance is typically localized to a small physical region in a circuit under test.

Mathematically, the Low Pass Step Transform is the integral of the Inverse Fourier Transform of the windowed vector—$S_{11}$. This transform mathematically relates TDR discontinuities to VSWR lobes. The broadly used term "windowed" refers to a specific weighting function applied to the pre-transform data. Windowing is required to prevent "leakage" after the Transform process. A window is a standard feature on many instruments, including all Agilent Technologies Digital Signal Processing (DSP) instruments.

As depicted in FIG. 2, a single small capacitive discontinuity of a TDR at t=0 generates a negative bump 210 in Low Pass Step Transform 201. If other capacitive bumps are added at times t=M*τ, where M is an integer and τ is any arbitrary time interval, VSWR lobes are created at frequencies f=N/τ, where N is an independent integer. This is because the phase at f=N/τ due to each capacitive bump is the same, so that energy addition is coherent and maximized. This is most easily understood as delay between capacitive bumps being an integer number of periods at frequency f=N/τ. Similarly, if inductive discontinuities, for example bump 202 (positive in Low Pass Step Transform 201) are added at times t=(M+0.5)*τ, they will also add coherently to the VSWR lobe at frequency f=1/τ and its odd harmonics. There is no relationship between M and N, which simply denote periodicity in the respective time and frequency domains. Consequently, the combination of their inverted time amplitude (relative to capacitive bumps 210) and their half-cycle delay results in $S_{11}$ phase equal to that due to capacitive bump 210, such that they constructively add.

In practice, a TDR measurement reveals a variety of discontinuities of varying size, spacing, and type (capacitive, inductive, or resistive). FIG. 2 for example depicts both abrupt 203 and gradual 204 resistive discontinuities. Nonetheless, the $S_{11}$ lobes represent those frequencies where the energy is most constructive (i.e., coherent), and the VSWR local minima are those frequencies where the energy is most canceled. By properly specifying the TDR measurement, based on information from the $S_{11}$ measurement, those TDR discontinuities which are coherent for a given VSWR lobe, as well as those which are canceling and orthogonal, can be unambiguously identified. Embodiments of the invention provide the following general capabilities:

(1) Use of a broadband Vector Network Analyzer for coordinated VSWR and TDR measurement.
(2) Configuration for identifying discontinuities correlated to a VSWR lobe.
(3) Calibrating the capacitive, inductive, and resistive discontinuities.

Figure 3:
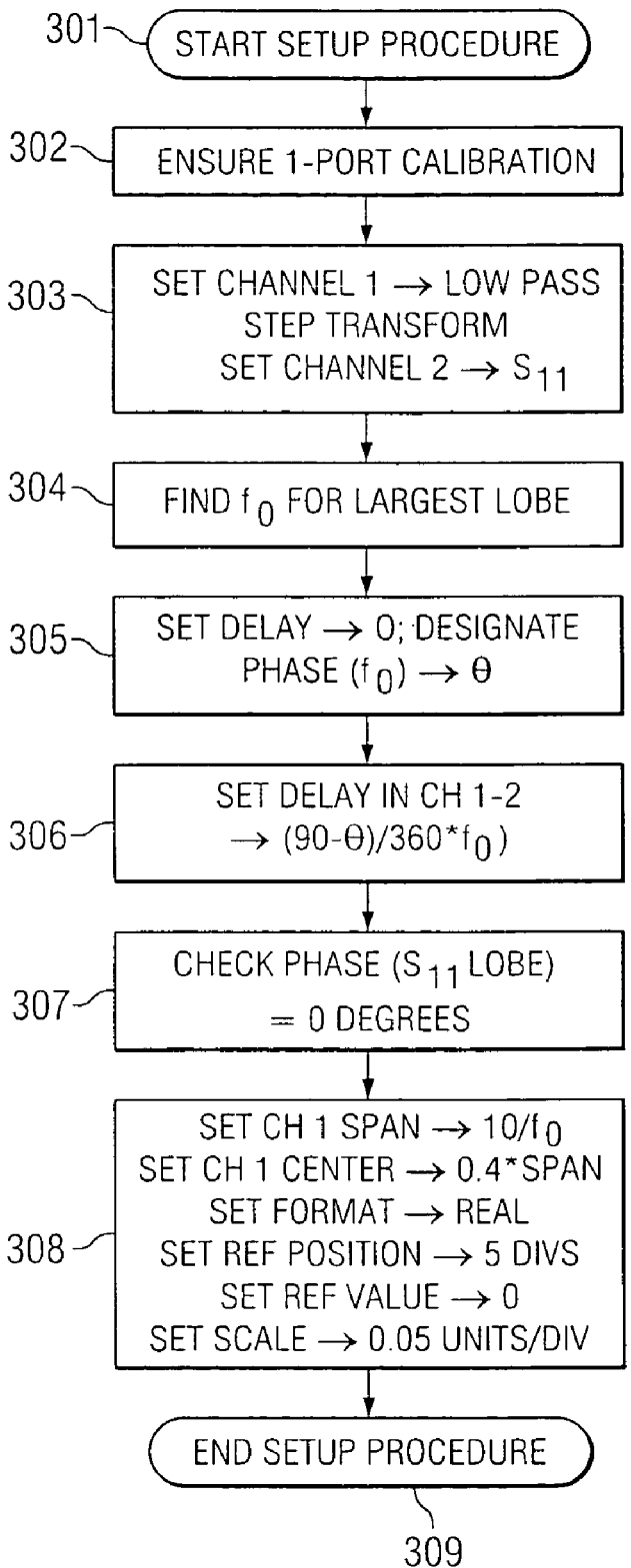
FIG. 3 is a flow diagram illustrating a measurement setup procedure (algorithm) for a VNA, in accordance with embodiments of the invention.

Frequency-domain measurements of VSWR or $S_{11}$ typically show a series of lobes. As described above, these are predominantly caused by phasing, due to the combination of size, type, and delay of the set of time-domain discontinuities. One or more lobes may occur in the frequency band where a design requires the lowest VSWR. Optimally, tuning efforts are focused on those circuit elements that contribute coherently to problem lobe(s). FIG. 3 is a flow diagram illustrating measurement setup procedure (algorithm) 300 for a VNA, in accordance with an embodiment of the invention, which includes the following operations:

(1) Ensure a valid 1-port calibration has been performed on the VNA, as depicted in operation 302. This calibration is performed at a defined physical plane at RF connector 19;
(2) Set Channel 1 to Low Pass Step Transform, and Channel 2 to $S_{11}$, as depicted in operation 303;
(3) Find $f_0$, the frequency at the peak amplitude of the largest $S_{11}$ lobe in the frequency band of interest, as depicted in operation 304;
(4) Set Electrical Delay to zero, then find the phase of $S_{11}$ at $f_0$, and denote this phase θ (degrees), as depicted in operation 305;
(5) Set Electrical Delay in both channels to (90−θ)/(360*$f_0$), as depicted in operation 306;
(6) Check phase ($S_{11}$ lobe) equal zero degrees, as depicted in operation 307; and
(7) Set Channel 1 Span to 10/$f_0$; Center to 0.4*span; Format to Real; Ref Position to 5 Divisions; Ref Value to zero; and Scale to 0.05 Units/division, as depicted in operation 308.

Measurement setup procedure 300 provides a powerful visual tool in emphasizing circuit modifications on those circuit discontinuities which directly (coherently) contribute to a problem VSWR lobe. By observing the TDR and $S_{11}$ displays concurrently, the relationships of discontinuity location and type to $S_{11}$ lobe magnitude follow a set of rules.

Figure 4:
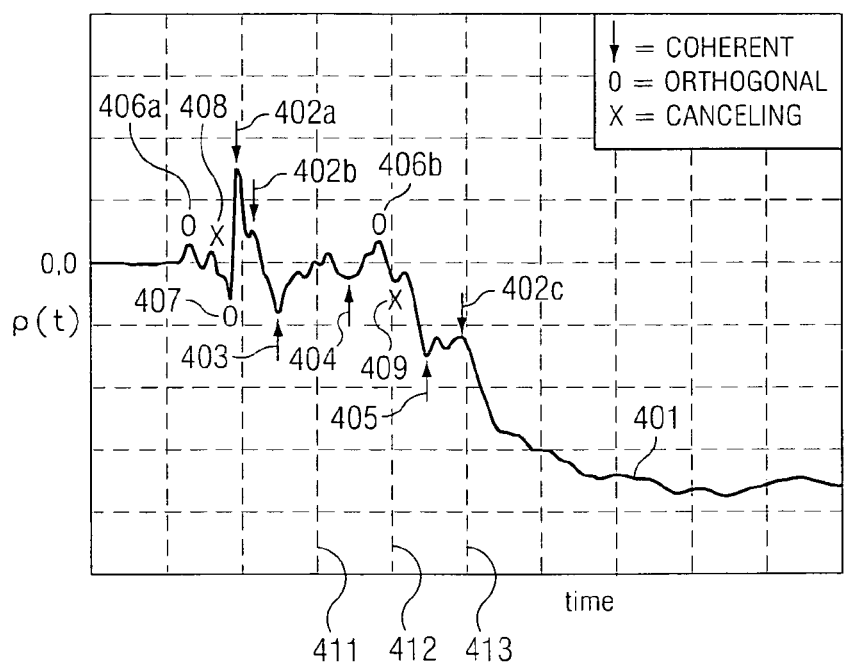
FIG. 4 is a graph depicting a TDR display showing a Low Pass Step Transform measurement of a typical device under test (DUT), in accordance with embodiments of the invention.

FIG. 4 is a graph depicting TDR display 12 showing a Low Pass Step Transform measurement 401 of a typical device under test, in accordance with embodiments of the invention. FIG. 4 shows an example of TDR display 12 for the case in which a problem VSWR lobe is located at 2.2388 GHz. The x-axis scaling is specified in accordance with setup procedure 300, such that the scale is 1/$f_0$ per division, which corresponds to a total time span of 10/$f_0$ for displays with 10 x-axis divisions. For example, if $f_0$=2 GHz, then the x-axis scale should be 0.5 nanosecond per division, or a total time span of 5 nanoseconds.

FIG. 4 depicts examples of coherent, orthogonal, and canceling discontinuities. Using setup procedure 300, all coherent discontinuities 402a–402c are positive (inductive) aligned with x-axis gridlines, for example 411–413, or are negative 403–405 (capacitive) aligned at midpoints between consecutive x-axis gridlines. Discontinuities at 25 per cent 406a or 75 per cent 406b, 407 within an x-axis division are orthogonal to the lobe energy and therefore make very low reflective contribution. In fact, the orthogonal energy across the entire TDR must sum to zero at the lobe frequency, since the transformed phase is exactly 90 degrees (after Electrical Delay adjustment) for the Low Pass Step Transform. These relationships can typically be verified by moving a small capacitive probe along the electrical path of the circuit under test.

Equally important, any capacitive bumps on vertical x-axis gridlines, for example discontinuity 409, actually cancel energy at the lobe of interest and therefore require no correction. This is also true for any inductive bumps, for example inductive discontinuity 408, at the midpoints between consecutive x-axis gridlines.

The reason why the 90 degree condition rather than the zero degree condition is used for time alignment is that the Low Pass Step Transform is the time integral of the Low Pass Impulse response, which is the direct Fourier transform of broadband $S_{11}$ scattering parameter. The time integral corresponds to a 90 degree phase shift in $S_{11}$. The time integral mathematical representation is also consistent with the observed magnitude increase of successive VSWR lobes with frequency. The time derivative in the inverse transform definition generates a $2\pi*f$ multiplier in $S_{11}$.

For the purpose of designing circuit modifications to correct or compensate identified TDR discontinuities of interest, it is important to know the magnitude of excess capacitance, inductance, or resistance causing the discontinuity. For calibration of resistance discontinuities, the resistance (or impedance) change is, $$\Delta R = Z_0*(1+\rho_{\tau+})/(1-\rho_{\tau+}) - Z_0*(1+\rho_{\tau-})/(1-\rho_{l-}) \quad (2)$$

where $\rho_{\tau-}$ is the TDR amplitude immediately before the resistive discontinuity, and $\rho_{\tau+}$ is the TDR amplitude immediately after the resistive discontinuity.

For small resistive discontinuities, $$\Delta R \approx 2*Z_0*\Delta\rho \text{ for } \Delta\rho<0.1 \quad (3)$$

For capacitive discontinuities, the Low Pass Step Transform in an infinite bandwidth system is:

$$\rho(t) = -u(t)*e^{-2t/(C*Z0)} \quad (4)$$

The parameter $\rho(t)$ in Equation (4) represents time-domain reflection as a function of time, as shown in examples in FIGS. 2 and 4, where u(t) represents the unit step function. With infinite bandwidth, each capacitive or inductive bump would be described by Equation (4) (and delayed in time by some amount). However, band-limited measurement causes the unit-exponentials to be spread in time and reduced in amplitude, with the resulting appearance in FIGS. 2 and 4.

For C=0.1 pF and $Z_0$=50 Ω, the time constant of this exponential pulse is 2.5 picoseconds with a corresponding bandwidth of about 64 GHz. Therefore, an 18 GHz VNA will limit the bandwidth of the pulse, lowering the amplitude and spreading it. Furthermore, the $S_{11}$ information is windowed prior to transform to prevent ringing in the TDR, reducing the TDR bandwidth to roughly 7 GHz, depending on the window chosen in the Transform setup. The displayed capacitive discontinuity is the time convolution of the VNA transform impulse response with the ideal response of Equation (4). In FIG. 4, label 0.0 identifies the y-axis reference value of 0.0 units.

Figure 5:
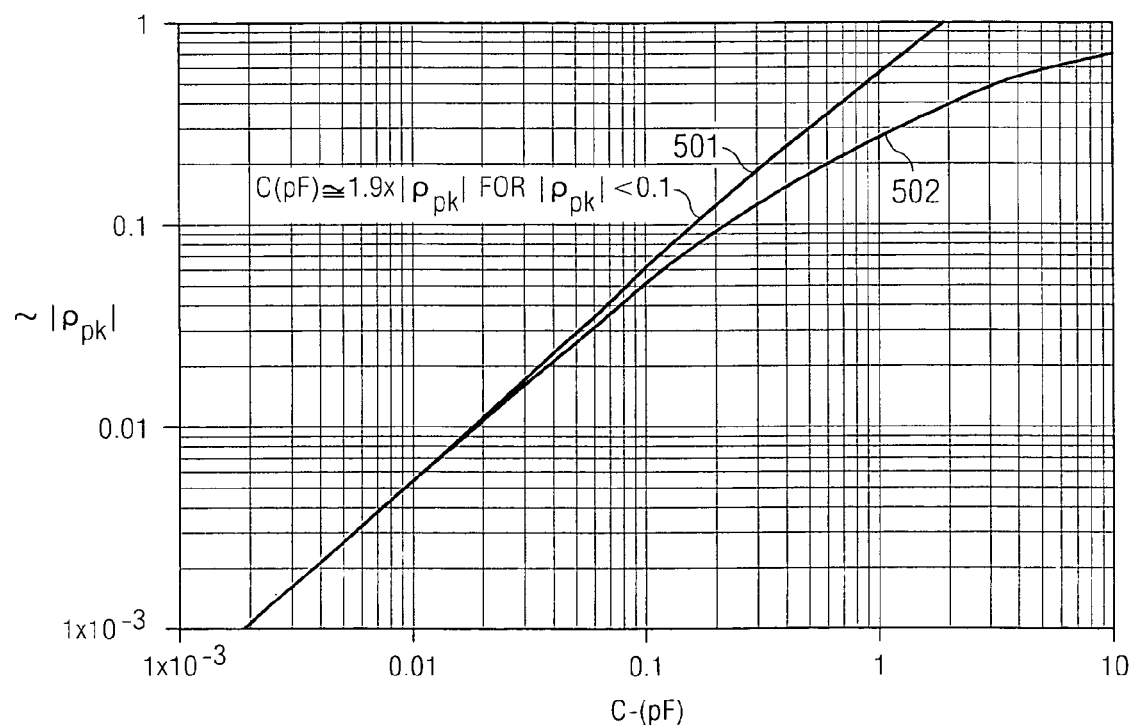
FIG. 5 is a graph illustrating the relationship between excess capacitance and discontinuity peak amplitude $|\rho_{pk}|$ specifically for an 18 GHz span and the NORMAL transform window of the Agilent Technologies PNA and 8510 VNAs, in accordance with embodiments of the invention.

FIG. 5 is a graph illustrating the relationship between excess capacitance versus discontinuity peak amplitude $|\rho_{pk}|$, in accordance with embodiments of the invention. The relationship in FIG. 5 specifically applies to an 18 GHz span and the NORMAL transform window of the Agilent Technologies PNA and 8510 VNAs, which use Kaiser-Bessel windowing. Curve 502 shows the analytical relationship between excess capacitance versus $|\rho_{pk}|$, whereas straight line 501 shows a linear approximation of the relationship, in accordance with Equation (5) below:

$$C \approx -Kc*|\rho_{pk}| \text{ for } |\rho_{pk}|<0.1, \quad (5)$$

where the constant of proportionality for capacitance is

Kc=1.9 pF.

The parameter $|\rho_{pk}|$ in Equation (5) is the peak amplitude of an isolated capacitive or inductive "bump" in the $\rho(t)$ trace, for example 202, 210, 402a–402c, and 408. The $|\rho_{pk}|$ of a specific capacitive bump is directly related to the amount of "excess capacitance." The relationship is calculated in Equation (5) and displayed in curve 502 of FIG. 5. For small bumps ($|\rho_{pk}|<0.1$) the relationship is approximately linear, as shown in line 501 of FIG. 5. If, for example, the scale of FIG. 2 is 0.05 units per division, then for capacitive "bump" 210, $|\rho_{pk}|=0.06$ (approximately). The value is measured from the "base" of the bump to the peak.

For small capacitive discontinuities (i.e. <0.2 pF), the peak amplitude $|\rho_{pk}|$ of the measured capacitive bump is approximately proportional to the excess capacitance. With specific knowledge of the frequency-domain windowing, this relationship can be derived analytically, but in practice it is simple to calibrate it physically using a conventional tuning stub of known capacitance.

Inductive discontinuities behave similarly to capacitive discontinuities, but with positive amplitude. Once the proportionality constant for capacitance has been determined as in Equation (5), the proportionality constant for inductance can be calculated as, $$K_L = Z_0^2 * Kc, \quad (6)$$

And the relationship for excess inductance is similarly, $$L \approx -K_L*|\rho_{pk}| \text{ for } |\rho_{pk}|<0.1 \quad (7)$$

where, in this case, $K_L$=4.75 nH.

Figure 6A:
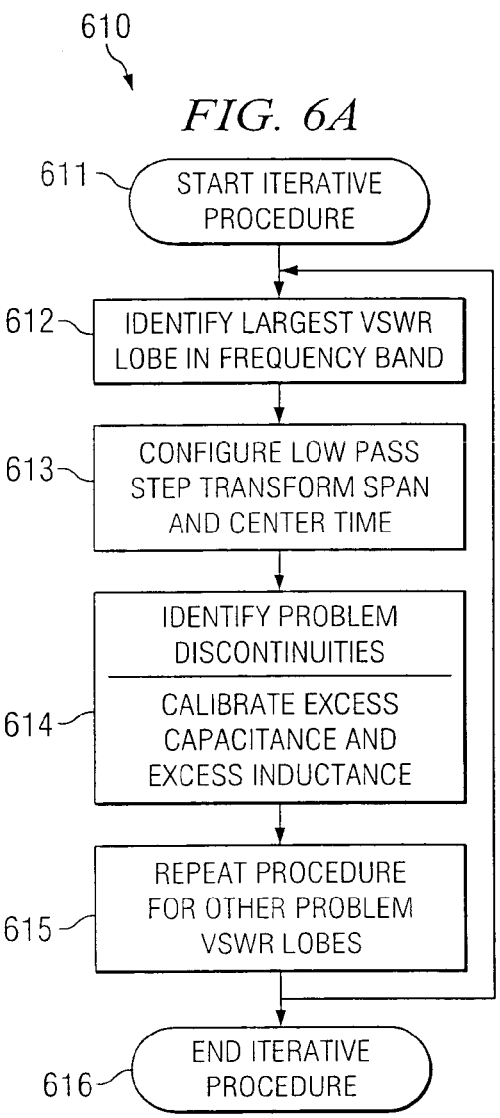
FIG. 6A is a flow diagram illustrating an iterative procedure, in accordance with embodiments of the invention.

A deterministic method of VSWR optimization has been described. The method requires a broadband VNA with Time Domain transform capability, for example the Agilent Technologies PNA and 8510 VNAs, for concurrent measurements of $S_{11}$ scattering parameter and Low Pass Step Transform. FIG. 6A is a flow diagram illustrating iterative procedure 610, including the following method operations:

1) In operation 612, the user identifies the largest VSWR lobe in the frequency band of interest; and uses $S_{11}$ phase data to find the correct electrical delay required to align the Low Pass Step Transform data.
2) In operation 613, the user configures the Low Pass Step Transform span and center time to place coherent inductive discontinuities on grid lines, and coherent capacitive discontinuities at grid midpoints.
3) In operation 614, the user identifies the problem discontinuities. Calibration of the discontinuity magnitude allows the design of correctly sized compensating features.
4) In operation 615, the user repeats the procedure for any other problem VSWR lobes in the frequency band of interest, in order of decreasing lobe magnitude.

Operations 612, 613, and 615 will be recognized as essentially similar to the operations depicted in procedure 300 of FIG. 3, whereas operation 614 depicts the calibration operation described in connection with FIG. 5. This method eliminates a substantial majority of trial-and-error iteration required by methods relying solely or serially on time domain or frequency domain measurement. It is the concurrent methodology and measurement capability which enables positive determination of those circuit discontinuities which coherently contribute to any given VSWR lobe.

Figure 6B:
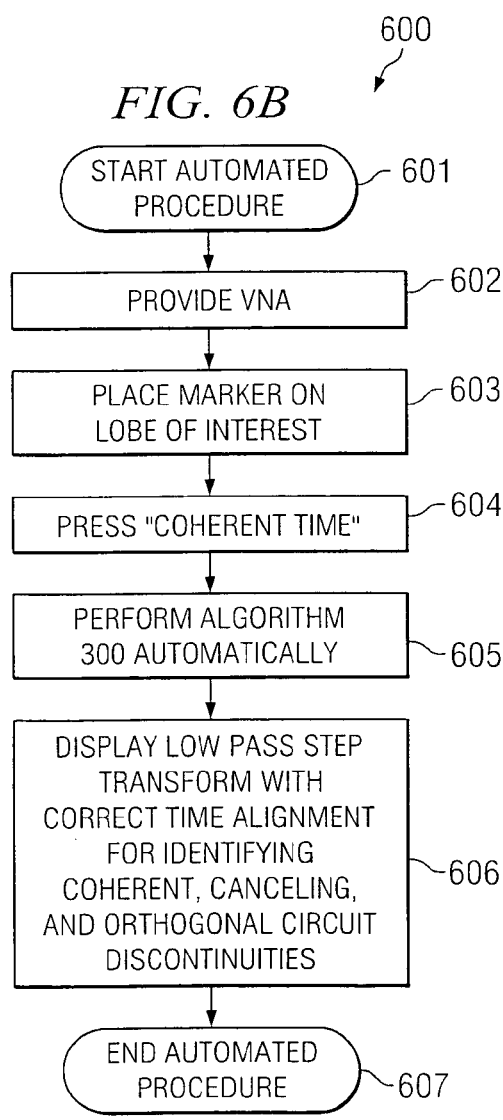
FIG. 6B is a flow diagram illustrating automated implementation of the measurement setup procedure of FIG. 3, in accordance with embodiments of the invention.

The above paragraphs describe only a manual implementation of TDR for analysis of circuit discontinuities and VSWR lobes. The manual method can be time-consuming, repetitive, and error-prone due to the multiple steps. Advantageously, a VNA, for example the Agilent PNA or 8510, can automatically implement these steps, thereby saving user time and reducing errors. FIG. 6B is a flow diagram illustrating automated implementation of the operations of the measurement setup procedure of FIG. 3, in accordance with embodiments of the invention.

(1) User provides a suitable VNA in operation 602. Then in operation 603, the user places a marker on a VSWR or $S_{11}$ lobe of interest. A marker is a conventional dot or other symbol, for example the triangular marker shown in FIG. 1, that is user-scrollable across a display trace. The x-axis and y-axis coordinates are displayed for the current marker position.

(2) In operation 604, the user presses a control key labeled, for example, "Coherent Time," thereby initiating automated execution of the procedure described in connection with FIG. 3;

(3) In operation 605, the Vector Network Analyzer automatically performs steps described above in connection with setup procedure 300 of FIG. 3;

(4) In operation 606, a Low Pass Step Transform is displayed with correct time alignment for identifying coherent, canceling, and orthogonal circuit discontinuities.

The automatic implementation requires: (1) A VNA having marker and internal processor capable of VNA state control and vector math; and (2) An algorithm which generates the desired display of "coherent, canceling, and orthogonal discontinuities."

Optionally, operation 614 of FIG. 6A can also be automated, providing automatic calibration of excess capacitance and excess inductance versus TDR discontinuity magnitude. This can, for example, be performed using a special marker or providing on the display the coefficients of proportionality.

While the invention has been described in conjunction with specific embodiments, it is evident to those skilled in the art that many alternatives, modifications, and variations will be apparent in light of the foregoing description. Accordingly, the invention is intended to embrace all other such alternatives, modifications, and variations that fall within the spirit and scope of the appended claims.

What is claimed is:

1. A method of using a vector network analyzer (VNA) for coordinated Voltage Standing-Wave Ratio (VSWR) and Time Domain Reflectometry (TDR) measurement, said method comprising:
   configuring said VNA for identifying discontinuities correlated to a VSWR lobe;
   identifying a largest VSWR lobe in the frequency band of interest;
   using phase data associated with $S_{11}$ scattering parameter to find the correct electrical delay required to align Low Pass Step Transform data; and
   configuring said Low Pass Step Transform span and center time to align coherent inductive and capacitive discontinuities relative to grid lines of a TDR display.

2. The method of claim 1 additionally comprising:
   setting a first channel to Low Pass Step Transform and a second channel to a scattering parameter $S_{11}$;
   finding $f_0$, the frequency at the peak amplitude of the largest lobe of said scattering parameter $S_{11}$ in the frequency band of interest;
   setting electrical delay to zero;
   finding the phase of $S_{11}$ at $f_0$;
   denoting said phase θ (degrees);
   setting electrical delay in said first and said second channels to $(90-\theta)/(360*f_0)$, such that said $S_{11}$ lobe phase reads 90 degrees;
   setting said first channel span to $10/f_0$;
   setting said first channel center to 0.4*span; and
   setting said first channel format to real.

3. The method of claim 2 additionally comprising:
   ensuring a valid 1-port calibration is performed on said VNA;
   setting said first channel reference position to five divisions;
   setting said first channel reference value to zero; and
   setting said first channel scale to 0.05 units per division.

4. The method of claim 1 additionally comprising repeating said method for any additional problem VSWR lobes in said frequency band of interest, in order of decreasing lobe magnitude.

5. The method of claim 1 further comprising calibrating the magnitudes of capacitive, inductive, and resistive discontinuities, thereby allowing the design of correctly sized compensating features.

6. The method of claim 2 wherein said method is performed manually.

7. The method of claim 2 wherein said method is performed automatically.

8. The method of claim 7 additionally comprising:
   providing a suitable VNA;
   placing by a user a user-scrollable display marker on a VSWR or $S_{11}$ lobe of interest;
   pressing a control key by said user, thereby initiating automated execution of said method; and
   automatically displaying a Low Pass Step Transform with correct time alignment for identifying coherent, canceling, and orthogonal circuit discontinuities.

9. The method of claim 8 wherein said suitable VNA comprises:
   a visual display;
   a processor operable to process time domain and frequency domain reflection signals for graphic presentation on said visual display, said processor capable of performing VNA state control and vector mathematical operations: and
   wherein said display includes a visual display marker having a recognizable shape.

10. The method of claim 5, wherein said method is performed automatically.

11. The method of claim 10 additionally comprising:
    providing a suitable VNA; and
    calculating the relationship of discontinuity amplitude to excess capacitance and/or excess inductance using a processor associated with said VNA.

12. The method of claim 11 additionally comprising placing a user-scrollable display marker on a time-domain discontinuity.

13. The method of claim 11 additionally comprising accepting at a user interface of said VNA y-axis scaling unit inputs of pF per division and/or nH per division.

14. The method of claim 11 additionally comprising selecting via a calibration enunciator of a TDR display of said VNA a scale in pF per division and/or nH per division in response to user interface entry of units per division.

* * * * *